(12) United States Patent
Lin

(10) Patent No.: US 9,893,214 B2
(45) Date of Patent: Feb. 13, 2018

(54) BUS BAR FOR SOLAR CELL COMPONENT

(71) Applicant: OVIS ENTERPRISES CO., LTD., New Taipei (TW)

(72) Inventor: Ching-Yu Lin, Taoyuan (TW)

(73) Assignee: OVIS ENTERPRISES CO., LTD., New Taipei (TW)

( * ) Notice: Subject to any disclaimer, the term of this patent is extended or adjusted under 35 U.S.C. 154(b) by 0 days.

(21) Appl. No.: 15/346,613

(22) Filed: Nov. 8, 2016

(65) Prior Publication Data

US 2017/0133519 A1 May 11, 2017

(30) Foreign Application Priority Data

Nov. 11, 2015 (TW) .............................. 104218080 U

(51) Int. Cl.
*H01L 31/02* (2006.01)
*H01L 31/05* (2014.01)

(52) U.S. Cl.
CPC ...... *H01L 31/0201* (2013.01); *H01L 31/0512* (2013.01)

(58) Field of Classification Search
CPC .................. H01L 31/0201; H01L 31/0512
USPC .......................................... 174/70 B
See application file for complete search history.

(56) References Cited

U.S. PATENT DOCUMENTS

2004/0261836 A1 * 12/2004 Kataoka .............. H01L 31/0236 136/244
2008/0115822 A1 * 5/2008 Cunningham ........ H01L 31/048 136/244

FOREIGN PATENT DOCUMENTS

CN 202977479 U * 6/2013
CN 202977479 U * 6/2013

* cited by examiner

*Primary Examiner* — Timothy Thompson
*Assistant Examiner* — Charles Pizzuto
(74) *Attorney, Agent, or Firm* — Li & Cai Intellectual Property (USA) Office

(57) ABSTRACT

A bus bar for solar cell component is provided. The bus bar includes a first copper ribbon, a second copper ribbon, a third copper ribbon and a fourth copper ribbon connected end-to-end. A first diode electrically bridges the first and the second copper ribbon; a second diode electrically bridges the second and the third copper ribbon; and a third diode electrically bridges the third and the fourth copper ribbon. A first electrical energy output terminal is formed at an end of the first copper ribbon corresponding to the second copper ribbon, and a second electrical energy output terminal is formed at an end of the fourth copper ribbon corresponding to the third copper ribbon.

10 Claims, 6 Drawing Sheets

BUS BAR FOR SOLAR CELL COMPONENT

BACKGROUND

1. Technical Field

The instant disclosure relates to a bus bar, in particular, to a bus bar for solar cell components.

2. Description of Related Art

The bus bars in the solar cell component are used to connect a plurality of solar cells, and to connect the solar cell component to external components through a terminal box, thereby achieving the object of convergence. However, the existing bus bars have the following problems:

1. Conventional bus bars employ at least two rows of bus bars to operate normally and hence, a large area on the component is needed.
2. The terminal box used with the existing bus bars has other electrical components such as diodes, printed circuit boards (PCB) or other wires installed therein and hence, the complexity of the arrangement inside the terminal box is very high. The terminal box needs to pass various safety tests before being used and the manufacturing process is complicated and high-cost.
3. Solar cell components are components that utilize large electrical current and extremely high power and hence, the sizes of electric components used thereby are large and have high heating power. Therefore, there is a problem of overheat, and the efficiency or lifetime of the solar cell components is reduced.
4. The manufacturing process and assembling process of the existing bus bars are complicated.

SUMMARY

In order to solve the problems above, the instant disclosure provides a bus bar for solar cell component, and the bus bar has good heat dissipation property and a simple terminal box structure, thereby effectively reducing the cost of the manufacturing process thereof.

An embodiment of the present disclosure provides a bus bar for solar cell component comprising a first copper ribbon, a second copper ribbon, a third copper ribbon and a fourth copper ribbon connected sequentially and end-to-end, a first diode electrically bridging the first copper ribbon and the second copper ribbon, a second diode electrically bridging the second copper ribbon and the third copper ribbon; and a third diode electrically bridging the third copper ribbon and the fourth ribbon. A first electrical energy output terminal is formed at an end of the first copper ribbon opposite to the second copper ribbon, and a second electrical energy output terminal is formed at an end of the fourth copper ribbon opposite to the third copper ribbon.

Another embodiment of the instant disclosure provides a bus bar for solar cell component comprising at least three copper ribbons connected sequentially and end-to-end and at least two diodes. Each diode is disposed and electrically bridging two adjacent copper ribbons, and the copper ribbons at both ends of the bus bar each have an electrical energy output terminal formed at an end of the copper ribbon far away from the diodes.

The advantage of the instant disclosure is that the area for assembling the solar cell component is significantly reduced since only one bus bar is used in a single solar cell component.

The terminal box used with the bus bar of the instant disclosure is only acted as a protective casing, and there is no need to install electrical components such as diode as conventional terminal boxes. Compared to the existing art, the bus bar provided by the instant disclosure has simplified the design and manufacturing process of the terminal box, thereby reducing the manufacturing cost and size of the terminal box. Therefore, the need for passing various safety tests is eliminated.

In addition, the bus bar provided by the instant disclosure can closely attach to the glass skin layer of the solar cell component and provides excellent heat dissipation efficiency. The bus bar can be pressed with the solar cell to become a pressing unit with complete function. Moreover, the manufacturing process of the bus bar is simple, and the cost of the process is reduced.

The bus bar of the instant disclosure can be directly connected to external electrical wires in series and has the technical effect of easy to assemble and easy to maintain.

In order to further understand the techniques, means and effects of the instant disclosure, the following detailed descriptions and appended drawings are hereby referred to, such that, and through which, the purposes, features and aspects of the instant disclosure can be thoroughly and concretely appreciated; however, the appended drawings are merely provided for reference and illustration, without any intention to be used for limiting the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the instant disclosure.

DESCRIPTION OF THE EXEMPLARY EMBODIMENTS

Figure 1:
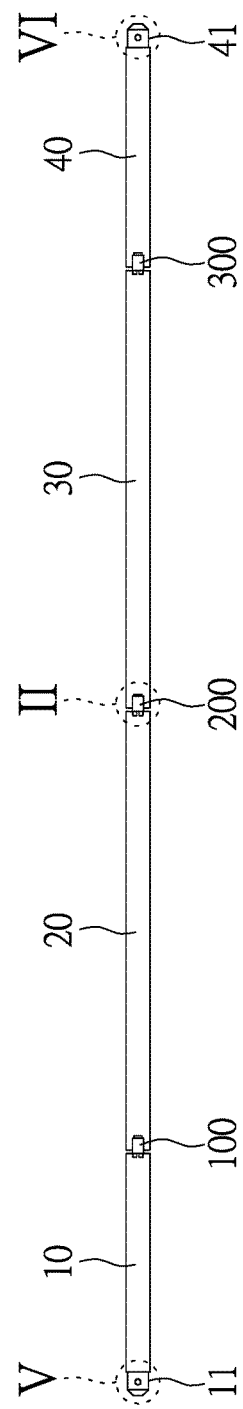
FIG. 1 is a top view of the bus bar for solar cell component provided by the instant disclosure.
Figure 2:
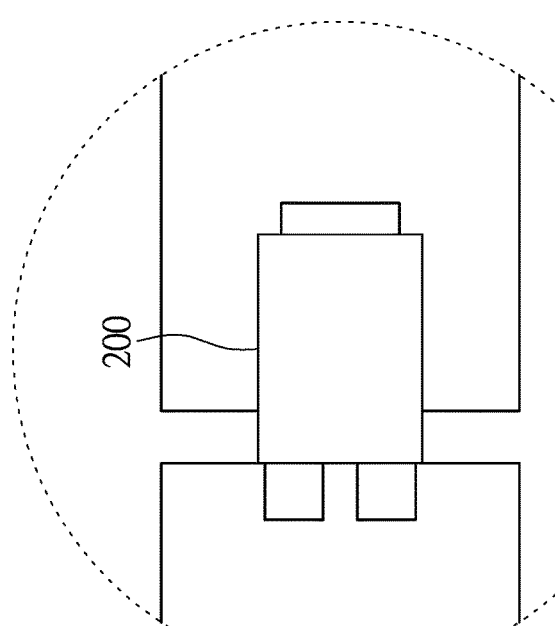
FIG. 2 is an enlargement view of part II of FIG. 1.
Figure 3:
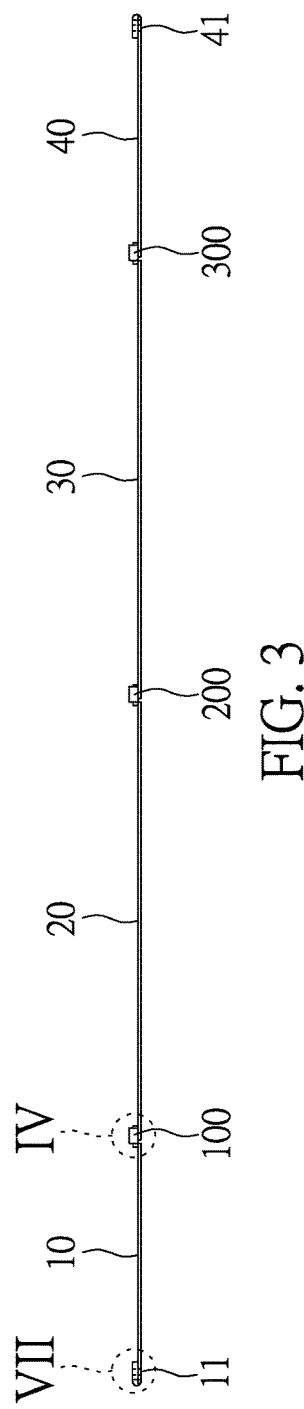
FIG. 3 is a side view of the bus bar for solar cell component provided by the instant disclosure.
Figure 4:
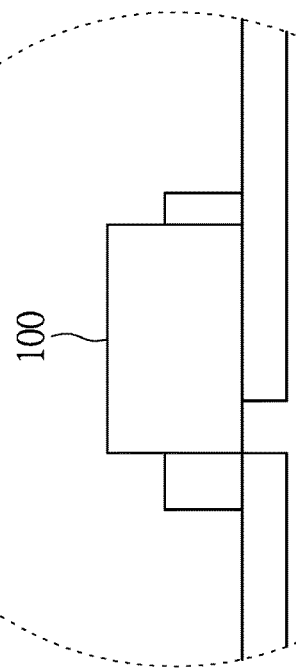
FIG. 4 is an enlargement view of part IV of FIG. 3.

Reference will now be made in detail to the exemplary embodiments of the instant disclosure, examples of which are illustrated in the accompanying drawings. Wherever possible, the same reference numbers are used in the drawings and the description to refer to the same or like parts.

Please refer to FIG. 1 to FIG. 4. FIG. 1 to FIG. 4 shows the preferable embodiment of the bus bar for solar cell component provided by the instant disclosure. The bus bar for solar cell component comprises a first copper ribbon 10, a second copper ribbon 20, a third copper ribbon 30 and a fourth copper ribbon 40. The copper ribbons connect sequentially and end-to-end. A first diode 100 electrically bridges the first copper ribbon 10 and the second copper ribbon 20, a second diode 200 electrically bridges the second cooper ribbon 20 and the third copper ribbon 30, and a third diode 300 electrically bridges the third copper ribbon 30 and the fourth copper ribbon 40. A first electrical energy output terminal 11 is formed at an end of the first copper ribbon 10 opposite to the second copper ribbon 20, and a second electrical energy output terminal 41 is formed at an end of the fourth copper ribbon 40 opposite to the third copper ribbon. The first electrical energy output terminal 11 and the second electrical energy output terminal 41 can be cathode and anode respectively, or can be anode and cathode respectively based on the user needs. The first copper ribbon 10, the second copper ribbon 20, the third copper ribbon 30 and the fourth copper ribbon 40 are made of copper which has good conductivity.

In an embodiment of the instant disclosure, the first copper ribbon 10, the second copper ribbon 20, the third copper ribbon 30 and the fourth copper ribbon 40 are strip-shaped, i.e., are rectangular. The length of the first copper ribbon 10 is smaller than the second copper ribbon 20. The length of the fourth copper ribbon 40 is smaller than the length of the third copper ribbon 30. Specifically, the length of the second copper ribbon 20 and the length of the third copper ribbon 30 are equal, and the length of the first copper ribbon 10 and the length of the fourth copper ribbon 40 are equal. The length of the first copper ribbon 10 is about half of the length of the second copper ribbon 20, and the length of the fourth copper ribbon 40 is about half of the third copper ribbon 30.

Figure 5:
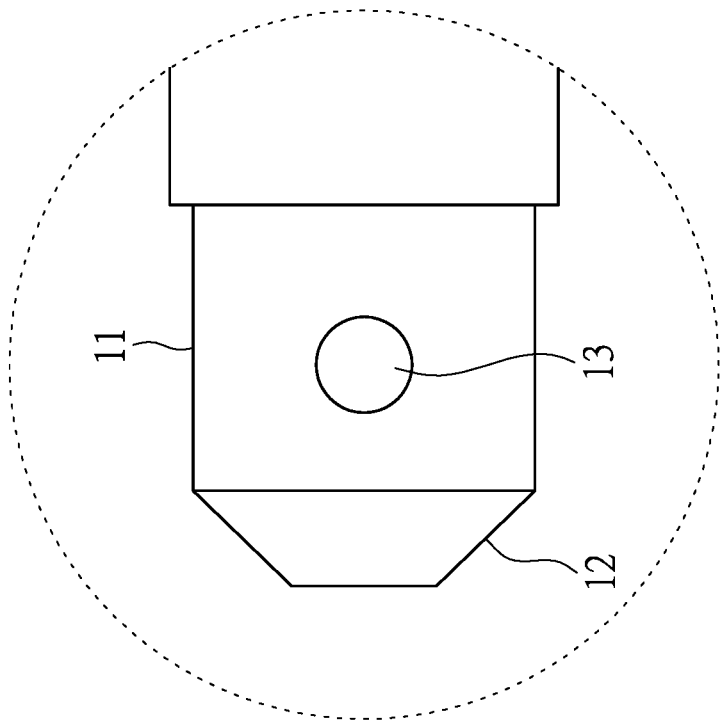
FIG. 5 is an enlargement view of part V of FIG. 1 which shows the first electrical energy output terminal of the bus bar for solar cell component provided by the instant disclosure.
Figure 7:
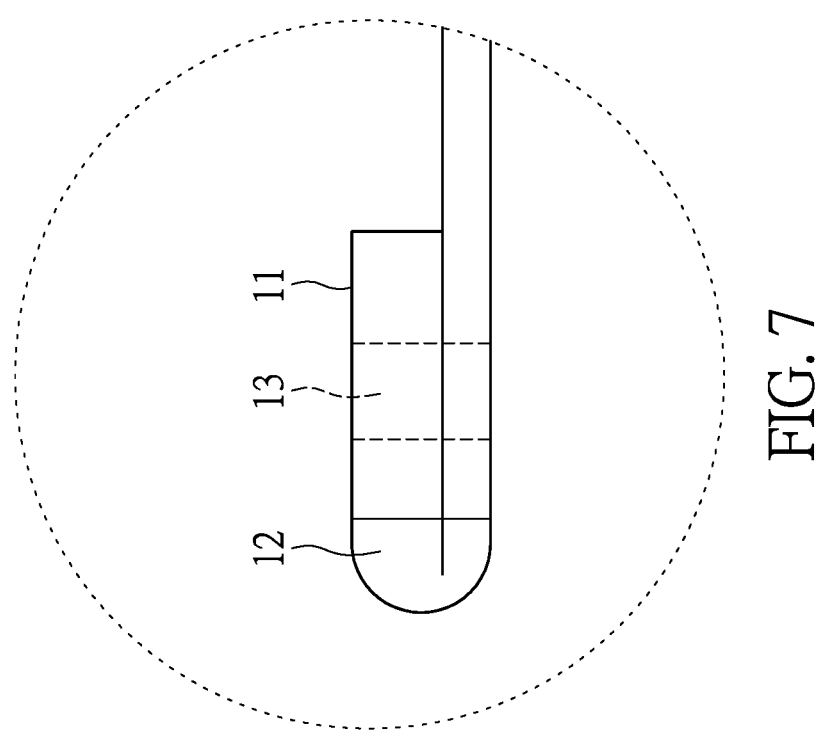
FIG. 7 is an enlargement view of part VII of FIG. 3 which shows the first electrical energy output terminal of the bus bar for solar cell component provided by the instant disclosure.

As shown in FIG. 5, in another embodiment of the instant disclosure, an inclined portion 12 is formed at each of the two opposite sides of the end of the first electrical energy output end 11 (located at an end of the first copper ribbon 10 opposite to the second copper ribbon 20). A suitable location at the center of the first electrical energy output terminal 11 has a first through hole 13. Therefore, the first electrical energy output end 11 is a component similar to a plug for connecting to external electrical wires.

Figure 6:
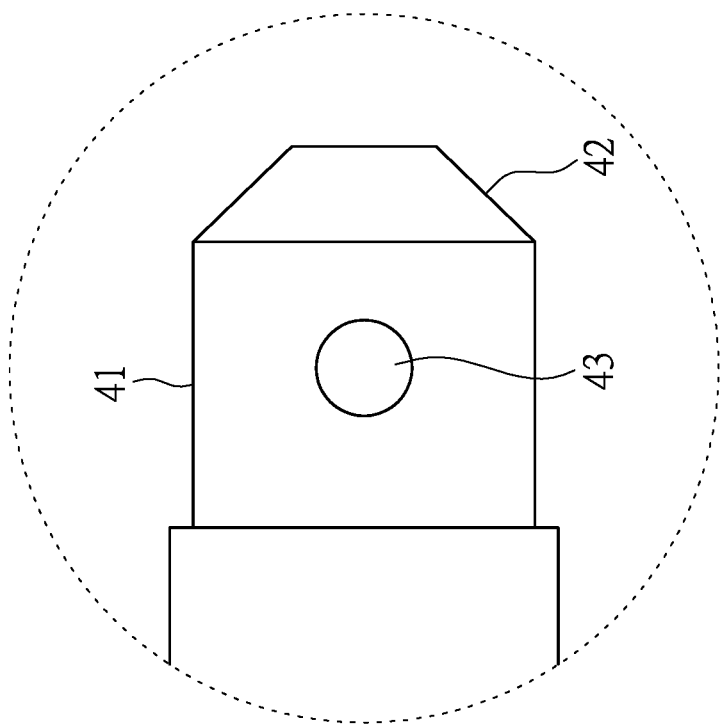
FIG. 6 is an enlargement view of part VI of FIG. 1 which shows the second electrical energy output terminal of the bus bar for solar cell component provided by the instant disclosure.

As shown in FIG. 6, in another embodiment of the instant disclosure, an inclined portion 42 is formed at each of the two opposite sides of the end of the second electrical energy output end 41 (located at an end of the fourth copper ribbon 40 opposite to the third copper ribbon 30) A suitable location at the center of the second electrical energy output terminal 41 has a second through hole 43. Therefore, the second electrical energy output end 41 is a component similar to a plug for connecting to external electrical wires.

In an embodiment, the bus bar for solar cell component provided by the instant disclosure comprises at least three copper ribbons connected end-to-end and at least two diodes. The diodes each are disposed between two adjacent copper ribbons, and electrically bridge the two adjacent copper ribbons. The copper ribbons at both ends of the bus bar each has an electrical energy output terminal formed at an end of the copper ribbon far away from the diodes.

The numbers of the copper ribbons and diodes of the bus bar provided by the instant disclosure are not limited and can be adjusted according to the needs related to the solar cell component. Theoretically, the numbers of the copper ribbons and diodes can be increased as long as the design satisfies the conditions mentioned above (each bus bar comprises at least three copper ribbons and the arrangement of the diodes). In another embodiment, the two opposite ends of the electrical energy output terminal each have an inclined portion and each have a through hole in a location at the center thereof. In addition, the copper ribbons are strip-shaped. The structure of the inclined portions and the through holes are similar to the structure shown in FIG. 5.

Figure 8:
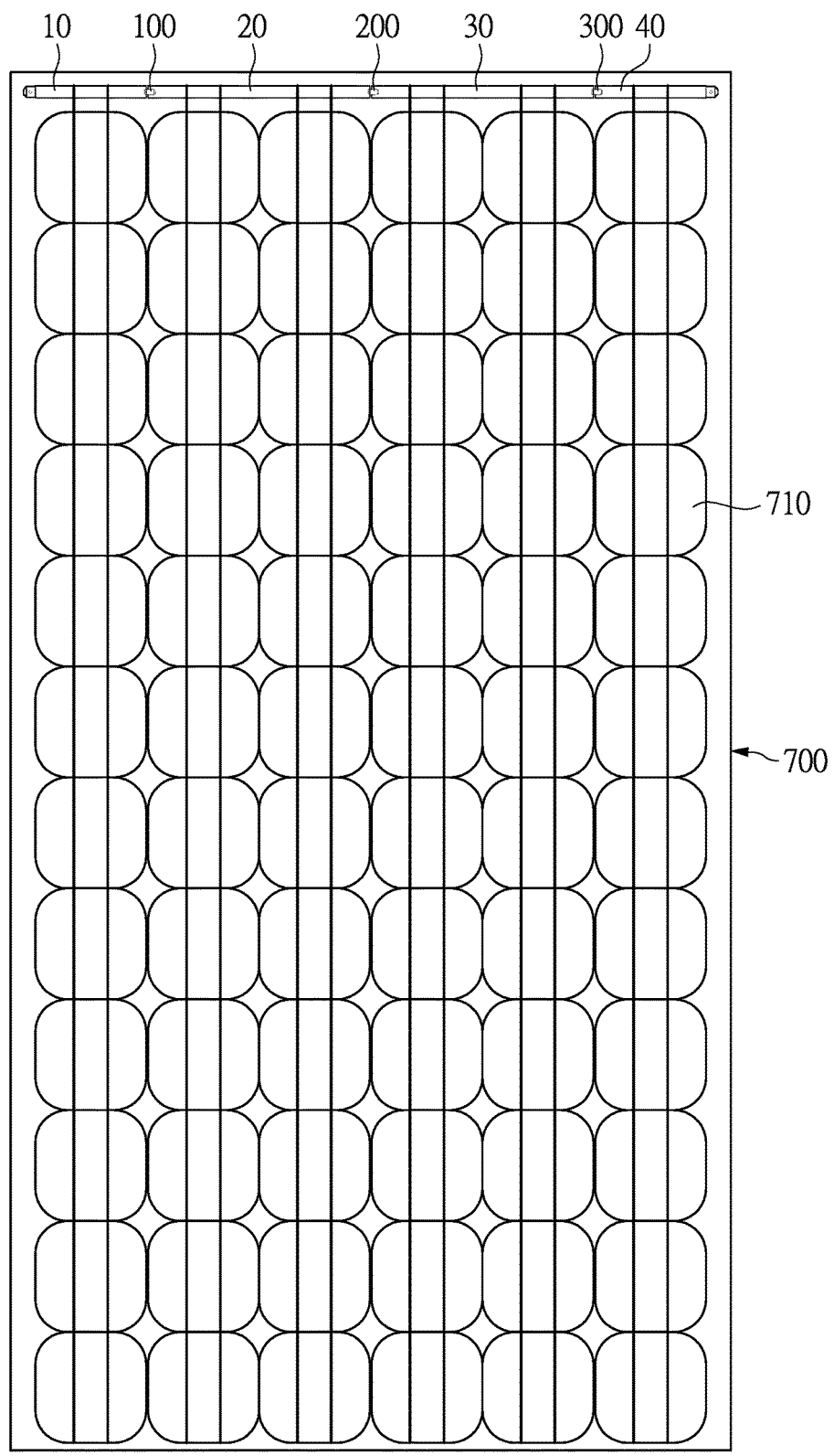
FIG. 8 is a front schematic view of the solar cell component using the bus bar provided by the instant disclosure.
Figure 9:
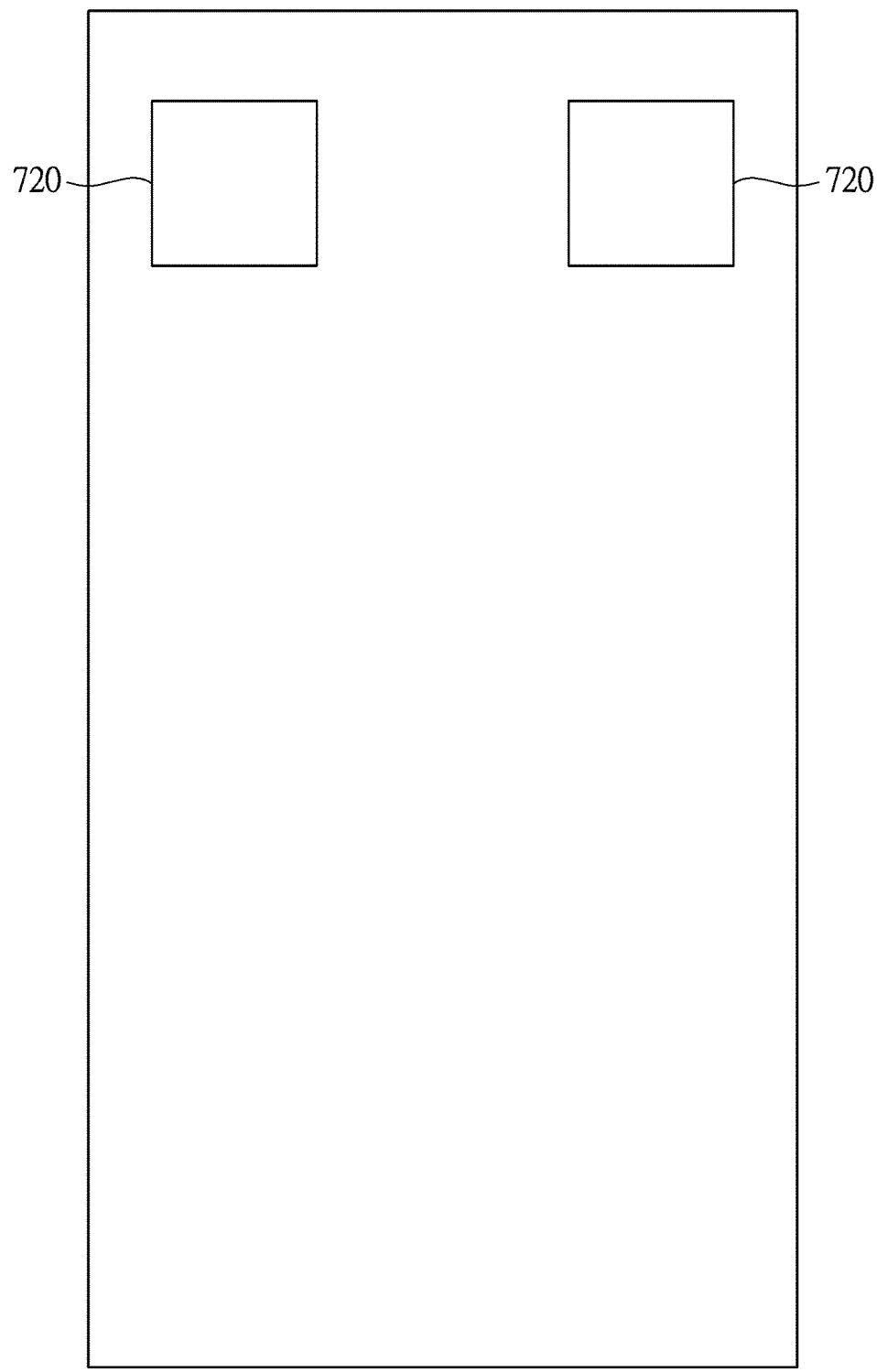
FIG. 9 is a rear schematic view of the solar cell component using the bus bar provided by the instant disclosure.

Please refer to FIG. 8 and FIG. 9. FIG. 8 and FIG. 9 show the relationship between the bus bar and the solar cell component provided by the instant disclosure. The solar cell component 700 comprises a plurality of solar cells 710 which are arranged in 6 rows and 12 columns. The arrangement of the solar cells 710 can be varied and the arrangement shown in the figure is only an example. The bus bar provided by the instant disclosure is disposed at a side (referred to as "the top side") of the solar cell component 700. The solar cells 710 in a row are connected to each other by a plurality of conductors, and are connected to the first copper ribbon 10, the second copper ribbon 20, the third copper ribbon 30 and the fourth copper ribbon 40. The number of the conductors passing through each solar cell 710 is 2. However, the number of the conductors passing through each solar cell 710 can be increased to 3 or 4 and is not limited to the figure.

The first electrical energy output terminal 11 and the second electrical energy output terminal 41 of the bus bar provided by the instant disclosure pass through the solar cell component 700 and are exposed to the rear surface of the solar cell component 700. In addition, a terminal box 720 is used to cover and protect the first electrical energy output terminal 11 and the second electrical energy output terminal 41, and is connected to external electrical wires.

In summary, the bus bar for solar cell component provided by the instant disclosure at least has the following advantages:

1. Conventional bus bars employ at least two rows of bus bars to operate normally and hence, a large area on the component is needed. In the instant disclosure, only one single bus bar provided by the instant is used and hence, the arrangement area is reduced.
2. The terminal box used with the existing bus bars has other electrical components such as diodes, printed circuit boards (PCB) or other wires installed therein and hence, the complexity of the arrangement inside the terminal box is very high. The terminal box needs to pass various safety tests before being used and the manufacturing process is complicated and high-cost. In contrast thereto, the terminal box used with the bus bar provided by the instant disclosure only encloses the electrical energy output terminals of the bus bar and electrical wires for connecting external electrical wires. Therefore, the terminal box used with the bus bar provided by the instant disclosure is only used as a protective casing and does not need to contain electrical components such as diodes. The simplified structure and manufacturing process of the terminal box reduces the manufacturing cost and the size of the terminal box, and eliminates the need for passing safety tests.
3. Solar cell components are components that utilize large electrical current and extremely high power and hence, the sizes of electric components used thereby are large and have high heating power. Therefore, there is a problem of overheat, and the efficiency or lifetime of the solar cell components is reduced. The bus bar provided by the instant disclosure is closely attached to the glass skin layer of the solar cell component and provides excellent heat dissipation efficiency. In addition, the bus bar can be pressed with the solar cell to form a pressing unit with complete function. Therefore, the bus bar provided by the instant disclosure can render the technical effect of simplifying the manufacturing process and reducing the cost.

4. The existing bus bars need additional connectors and the manufacturing process is complicated. The bus bar provided by the instant disclosure can be directly connected to external electrical wires in series and hence, the manufacturing process thereof is simplified.

The above-mentioned descriptions represent merely the exemplary embodiment of the present disclosure, without any intention to limit the scope of the instant disclosure thereto. Various equivalent changes, alterations or modifications based on the claims of the instant disclosure are all consequently viewed as being embraced by the scope of the instant disclosure.

What is claimed is:

1. A bus bar for solar cell component, comprising:
   a first copper ribbon, a second copper ribbon, a third copper ribbon and a fourth copper ribbon connected sequentially and end-to-end;
   a first diode electrically bridging the first copper ribbon and the second copper ribbon;
   a second diode electrically bridging the second copper ribbon and the third copper ribbon;
   a third diode electrically bridging the third copper ribbon and the fourth copper ribbon;
   a first electrical energy output terminal directly connected to an end of the first copper ribbon opposite to the second copper ribbon; and
   a second electrical energy output terminal directly connected to an end of the fourth copper ribbon opposite to the third copper ribbon.

2. The bus bar for solar cell component according to claim 1, wherein two opposite sides of the first electrical energy output terminal and two opposite sides of the second electrical energy output terminal each have an inclined portion.

3. The bus bar for solar cell component according to claim 1, wherein the first electrical energy output terminal and the second electrical energy output terminal have a first through hole and a second through hole respectively.

4. The bus bar for solar cell component according to claim 1, wherein a length of the first copper ribbon is smaller than a length of the second copper ribbon.

5. The bus bar for solar cell component according to claim 1, wherein a length of the fourth copper ribbon is smaller than a length of the third copper ribbon.

6. The bus bar for solar cell component according to claim 1, wherein the first copper ribbon, the second copper ribbon, the third copper ribbon and the fourth copper ribbon are strip-shaped.

7. A bus bar for solar cell component, comprising: at least three copper ribbons connected sequentially and end-to-end, and at least two diodes, wherein each diode is disposed and electrically bridges two adjacent copper ribbons, and the copper ribbons at both ends of the bus bar each have an electrical energy output terminal directly connected to an end of the copper ribbon far away from the diodes.

8. The bus bar for solar cell component according to claim 7, wherein two opposite sides of the electrical energy output terminal each have an inclined portion.

9. The bus bar for solar cell component according to claim 7, wherein the electrical energy output end has a through hole.

10. The bus bar for solar cell component according to claim 7, wherein the copper ribbons are strip-shaped.

* * * * *